United States Patent
Furumoto et al.

(10) Patent No.: US 8,956,143 B2
(45) Date of Patent: Feb. 17, 2015

(54) LITHOGRAPHY SYSTEM AND LITHOGRAPHY METHOD

(75) Inventors: Mitsuhiro Furumoto, Takasaki (JP); Keiji Emoto, Saitama (JP)

(73) Assignee: Canon Kabushiki Kaisha (JP)

( * ) Notice: Subject to any disclaimer, the term of this patent is extended or adjusted under 35 U.S.C. 154(b) by 223 days.

(21) Appl. No.: 13/324,046

(22) Filed: Dec. 13, 2011

(65) Prior Publication Data
US 2012/0153537 A1 Jun. 21, 2012

(30) Foreign Application Priority Data

Dec. 17, 2010 (JP) ................................. 2010-281722
Jun. 2, 2011 (JP) ................................. 2011-124068

(51) Int. Cl.
*G03F 7/20* (2006.01)
*G05B 13/04* (2006.01)

(52) U.S. Cl.
CPC ............ *G03F 7/70725* (2013.01); *G03F 7/709* (2013.01); *G03F 7/70991* (2013.01); *H01J 2237/0216* (2013.01); *H01J 2237/3175* (2013.01); *Y10S 977/887* (2013.01)
USPC .............. 425/385; 977/887; 355/53; 264/496

(58) Field of Classification Search
CPC ........................................... G05B 2219/49176
USPC ......................................... 977/887; 425/385
See application file for complete search history.

(56) References Cited

U.S. PATENT DOCUMENTS

| | | | | |
|---|---|---|---|---|
| 4,929,874 A | * | 5/1990 | Mizuno et al. | 318/128 |
| 5,091,953 A | * | 2/1992 | Tretter | 381/71.12 |
| 6,900,881 B2 | * | 5/2005 | Sreenivasan et al. | 355/72 |
| 2002/0054280 A1 | * | 5/2002 | Tokuda et al. | 355/53 |
| 2006/0145647 A1 | * | 7/2006 | Kitatsuji et al. | 318/568.11 |
| 2008/0114473 A1 | * | 5/2008 | Heiland | 700/44 |
| 2009/0005998 A1 | * | 1/2009 | Orishimo | 702/15 |
| 2013/0101382 A1 | * | 4/2013 | Okada et al. | 414/800 |

FOREIGN PATENT DOCUMENTS

| | | |
|---|---|---|
| JP | 2001020996 A | 1/2001 |
| JP | 2008115966 A | 5/2008 |

* cited by examiner

*Primary Examiner* — Matthew Daniels
(74) *Attorney, Agent, or Firm* — Rossi, Kimms & McDowell LLP

(57) ABSTRACT

A lithography system includes at least two lithography apparatuses disposed on the same fixed base, each of which includes an object, a moving body, and a vibration isolation unit. A control unit configured to control the lithography apparatuses controls a vibration isolation unit included in a first lithography apparatus based on driving instruction information to be given to a moving body included in a second lithography apparatus, and a control indicator regarding vibration directed onto an object to be vibration-isolated included in the first lithography apparatus due to a moving operation of the moving body.

12 Claims, 6 Drawing Sheets

LITHOGRAPHY SYSTEM AND LITHOGRAPHY METHOD

BACKGROUND OF THE INVENTION

1. Field of the Invention

The present invention relates to a lithography system and a lithography method.

2. Description of the Related Art

As the demand for microfabrication of semiconductor devices increases, not only a conventional photolithography technology but also a microfabrication technology in which a mold and an uncured resin on a substrate are pressed against each other to thereby form a resin pattern, which corresponds to the fine concave and convex pattern formed on the mold, on the substrate have received considerable attention. This technology is also referred to as an "imprint technology", by which a fine structure with dimensions of a few nanometers can be formed on the substrate. One example of imprint technologies includes a photo-curing method. An imprint apparatus employing the photo-curing method first applies an ultraviolet curable resin (imprint resin, photocurable resin) to the shot area (imprint area) on the substrate (wafer). Next, the resin (uncured resin) and a mold are pressed against each other. After the ultraviolet curable resin is irradiated with ultraviolet light for curing, the cured resin is released from the mold, whereby a resin pattern is formed on the substrate.

Also, in the imprint apparatus, the transfer accuracy needs to be in the order of a few nanometers as described above while keeping the positioning error tolerance caused by the apparatus in the range of from a few to tens of nanometers and the transfer speed also needs to be increased. In general, the transfer speed using an imprint apparatus takes a longer time as compared to using an exposure system such as a conventional stepper, scanner, or the like, and thus, the throughput of a single imprint apparatus is low. Accordingly, for example, a method for driving a substrate stage, which effects positioning of a substrate, at high speed, or a method for employing an imprint system having a cluster configuration in which a plurality of imprint apparatuses is installed at a device manufacturing factory may be employed. In particular, when an imprint system having a cluster configuration is used, the cost for each imprint apparatus is lower as compared to that for each liquid immersion exposure apparatus. Consequently, such an imprint system is advantageous in achieving low cost even when a plurality of imprint apparatuses is installed.

However, an improvement in transfer speed and transfer accuracy may often be in a tradeoff relationship. Specifically, a high speed drive of a substrate stage may not only increase a reaction force, which is generated therein, to thereby vibrate the apparatus but also affect other apparatuses that are disposed therearound. In particular, even if the vibration generated in a single apparatus is small in the case of employing a cluster configuration, the vibration is amplified by superimposing a phase and a directional component of vibration generated in a plurality of apparatuses, resulting in vibration of the entire floor of a factory having a cluster configuration. For example, in an imprint apparatus, when a mold is pressed against a photocurable resin to each other during an imprint operation, a positional relationship therebetween is held with high accuracy depending on the pre-acquired positional condition. However, when such vibration is delivered to the apparatus, the contact interface between the mold and the uncured resin becomes unstable, resulting in degradation in transfer accuracy. Hence, in the case of a high-value-added exposure apparatus, for example, a counter mass is installed to eliminate vibration to be delivered to the exterior. Consequently, the effects on surrounding other exposure apparatuses therearound are reduced. In contrast, the installation of a counter mass is disadvantageous for an imprint apparatus that is advantageous in reducing cost or footprint. Therefore, in an imprint apparatus, a vibration isolation unit, which is provided as an alternative to a counter mass, is typically installed so as to block transmission of vibration from the exterior as much as possible.

An example of such a vibration isolation unit includes a so-called active-type vibration isolation unit that detects vibration of an object to be vibration-isolated and vibration of a floor on which the apparatus is located using a measuring instrument, and drives the object to be vibration-isolated using an actuator depending on an output signal. The active-type vibration isolation unit has a vibration isolation performance higher than that of a passive vibration isolation unit configured only by a support mechanism having spring and damper characteristics. In this case, there are two methods for controlling the drive of an actuator. One of the methods is a controlling method (feedback control) for directly detecting vibration of an object to be vibration-isolated using a measuring instrument and driving an actuator so as to suppress such vibration. The other method is a method (feedforward control) for providing a measuring instrument for measuring the vibration of the installation floor and predicting the vibration to be delivered from the installation floor to the object to be vibration-isolated depending on the output value by the measuring instrument to thereby drive an actuator so as to cancel out such vibration. The former method has its limits for the complete control since control is executed in a reflective manner based on disturbances generated in the object to be vibration-isolated. However, the latter method has a great effect of isolating vibration since control is executed in advance with respect to such disturbance. The vibration isolation unit disclosed in Japanese Patent Laid-Open No. 2001-20996 employs a control technology as described above. On the other hand, the active vibration isolation unit disclosed in Japanese Patent Laid-Open No. 2008-115966 executes feedforward control not based on measurement information from the installation floor but based on the drive signal of a moving body on the object to be vibration-isolated.

However, since the vibration isolation unit disclosed in Japanese Patent Laid-Open No. 2001-20996 measures the vibration of the installation floor and executes feedforward control based on the measured value, the control result may readily be influenced by the capability of the measuring instrument. In other words, the vibration isolation unit generates the driving force of an actuator based on the measured value. Thus, if an error exists in the measured value, the vibration isolation unit may undesirably amplify the vibration. Also, in a typical measuring instrument, noise is readily superimposed upon measuring vibration in a low frequency range, and thus, a high pass filter or the like may be used so as to eliminate effect of such noise. Furthermore, a low eigenvalue member is used in the vibration isolation unit so as to ensure the vibration isolation performance. However, since the vibration isolation unit resonates in a low frequency range, the vibration isolation unit needs to suitably suppress vibration having a low frequency component. For that purpose, since the measured value components in a low frequency range is eliminated in the vibration isolation unit, the effective vibration isolation effect may not be obtained.

Also, in the active vibration isolation unit disclosed in Japanese Patent Laid-Open No. 2008-115966, the position and the acceleration of a moving body are estimated based on control information for the moving body, and a control force is directed to an actuator further based on these values. In this case, since a moving body is present on an object to be vibration-isolated, a force to be imparted to the object to be vibration-isolated by the moving body is readily estimated. However, the active vibration isolation unit has no effect on the vibration from the installation floor.

SUMMARY OF THE INVENTION

Accordingly, the present invention provides a lithography system that is capable of damping the transmission of vibration from devices around a lithography apparatus in the cluster configuration including the lithography apparatuses.

According to an aspect of the present invention, a lithography system is provided that includes at least two lithography apparatuses that are disposed on the same fixed base, each of which comprising an object to be vibration-isolated, a moving body that moves based on driving instruction information, and a vibration isolation unit configured to generate a vibration suppression force for suppressing vibration imparted to the object to be vibration-isolated; and a control unit configured to control the lithography apparatuses, wherein the control unit controls a vibration isolation unit included in a first lithography apparatus based on the driving instruction information to be given to a moving body included in a second lithography apparatus, and a control indicator regarding vibration directed onto an object to be vibration-isolated included in the first lithography apparatus due to a moving operation of the moving body.

According to the present invention, a lithography system that is capable of damping transmission of vibration from devices around a lithography apparatus in the cluster configuration including the lithography apparatus may be provided.

Further features of the present invention will become apparent from the following description of exemplary embodiments with reference to the attached drawings.

DESCRIPTION OF THE EMBODIMENTS

Imprint Apparatus

Figure 1:
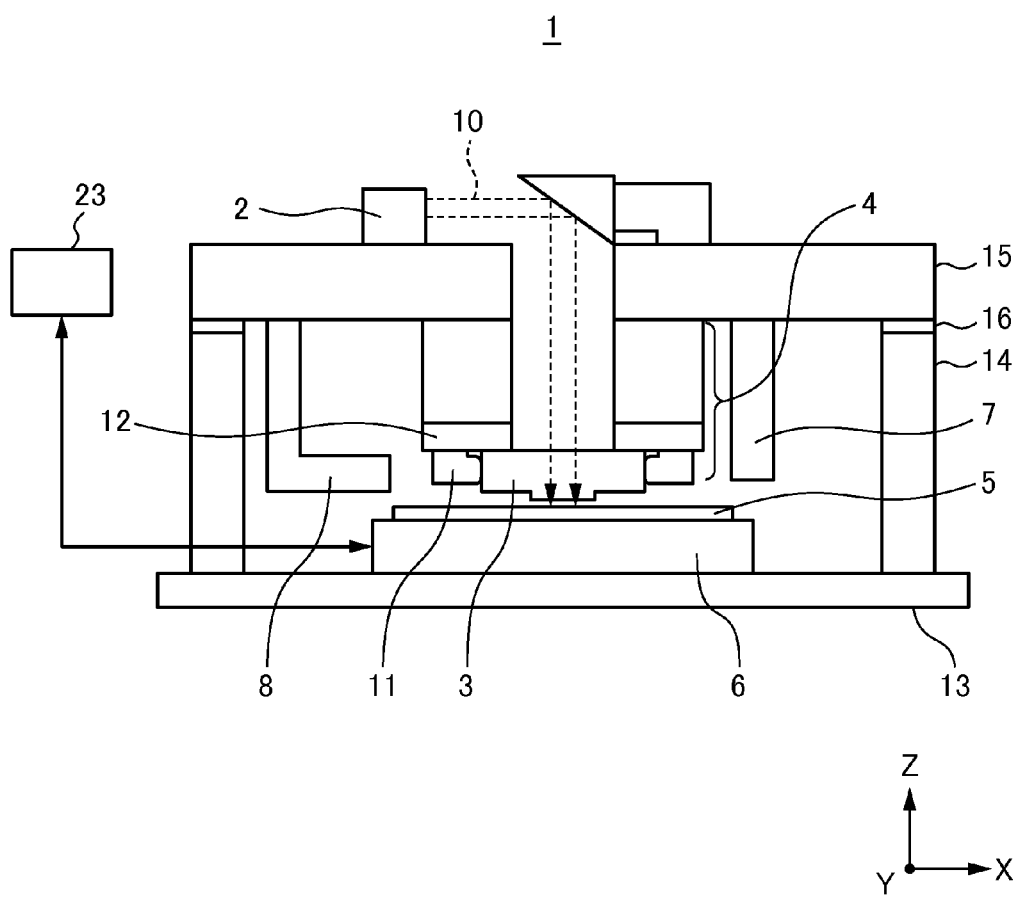
FIG. 1 is a schematic view illustrating the configuration of an imprint apparatus.

Firstly, a description will be given of an imprint apparatus to be applied to a lithography system or a lithography method, which will be described below, according to an embodiment of the present invention. FIG. 1 is a schematic view illustrating the configuration of an imprint apparatus. The imprint apparatus according to the present embodiment is a processing apparatus that transfers the concave and convex pattern of a mold onto a wafer (a substrate), i.e., a treatment object substrate, which is used for a semiconductor device manufacturing process, and is an apparatus that employs a photo-curing method used in imprint technologies. In FIG. 1, a description will be given where the Z axis is aligned in parallel to the irradiation axis of light (ultraviolet light) for a mold, the X axis is aligned in the direction in which a wafer moves with respect to a mold base, to be described below, in a plane perpendicular to the Z axis, and the Y axis is aligned in the direction perpendicular to the X axis. The imprint apparatus 1 includes an illumination unit 2, a mold holding device 4, a wafer stage 6, an application unit 7, and a mold transfer unit 8.

The illumination unit 2 is a unit configured to irradiate a mold 3 with ultraviolet light 10 during imprint processing. The illumination unit 2 is constituted by a light source and a plurality of optical elements that adjusts ultraviolet light emitted from the light source to a light suitable for imprinting. The mold holding device 4 is a device that holds and fixes the mold 3. The mold holding device 4 includes a shape correction mechanism 11 that corrects the pattern formed on the mold 3 to the desired shape by applying a compressive force to the mold 3, and a mold base 12 that draws and holds the mold 3 using suction force or electrostatic force. Also, the mold holding device 4 includes a base driving mechanism (not shown) that drives the mold base 12 in the Z-axial direction so as to press the mold 3 against an ultraviolet curable resin applied on the wafer 5. While the imprint apparatus 1 is configured to drive the mold 3 in the Z direction as described above, the imprint apparatus 1 may also be configured to drive the wafer stage 6 (the wafer 5) in the Z direction.

The wafer 5 is a treatment object substrate consisting of, for example, a single crystal silicon, and the ultraviolet curable resin (hereinafter referred to simply as "resin"), which serves as a portion to be molded, is applied on a treatment surface. Also, the wafer stage 6 is a substrate holding unit (moving body) that holds the wafer 5 by vacuum suction and is freely moveable in the XY plane. An application unit (dispenser) 7 is a unit configured to apply an uncured resin onto the wafer 5. A resin is a photocurable resin having the property of being cured by irradiation of ultraviolet light, and is appropriately selected by the type of a semiconductor device to be manufactured. Furthermore, the mold transfer unit 8 is a transfer unit configured to transfer the mold 3 so as to dispose the mold 3 with respect to the mold base 12.

Furthermore, the imprint apparatus 1 includes a platen 13, a frame 14, a base member 15, and a vibration isolation unit 16. The platen 13 is a plane plate member that supports the imprint apparatus 1 overall, and forms a reference plane for the movement of the wafer stage 6. The frame 14 is a support that is disposed on the platen 13 and supports the base member 15, which holds various components such as the mold holding device 4 or the like located above the wafer 5, via the vibration isolation unit 16. Here, the vibration isolation unit 16 is a vibration isolation unit having a function of reducing transmission of vibration from the floor.

Next, imprint processing performed by the imprint apparatus 1 will now be described. Firstly, a control unit (to be described below) places and fixes the wafer 5 on the wafer stage 6, and then moves the wafer stage 6 to the application position of the application unit 7. Then, the application unit 7 applies a resin (uncured resin) to a predetermined shot (area to be processed) on the wafer 5 in an application step. Next, the control unit moves the wafer stage 6 such that the coating surface on the wafer 5 is placed in a position directly below the mold 3. Next, after the imprint surface of the mold 3 is aligned with the coating surface on the wafer 5 and the shape of the mold 3 is corrected using the shape correction mechanism 11, the control unit drives the base driving mechanism so as to contact the mold 3 against the resin on the wafer 5 (contacting step). During the imprinting of the mold 3, the resin flows along the concave and convex pattern formed on the mold 3. Under this condition, the illumination unit 2 emits ultraviolet light from the back surface (top surface) of the mold 3, and the resin is cured by the ultraviolet light 10 that has been transmitted through the mold 3 in a curing step. After the resin is cured, the control unit drives the base driving mechanism again to thereby release the mold 3 from the wafer 5 (releasing step). By the aforementioned steps, a three dimensionally shaped resin layer following the pattern of the mold 3 is formed on the shot surface of the wafer 5.

(Charged Particle Beam Exposure Apparatus)

A lithography apparatus configuring the cluster serving as the lithography system or the lithography method of the present embodiment is not limited to the imprint apparatus 1 described above, but may be a charged particle beam exposure apparatus. The charged particle beam exposure apparatus is an exposure apparatus that employs electron beams or ion beams as a light source. In this case, examples of an exposure method includes a method for drawing a pattern by scanning electron beams itself on a wafer, and a method for transferring an original pattern onto a wafer by reshaping electron beams into a desired shape using an original (reticle or mask). In particular, when high throughput is required, a multi-beam method using a plurality of electron beams is employed.

First Embodiment

Figure 2A:
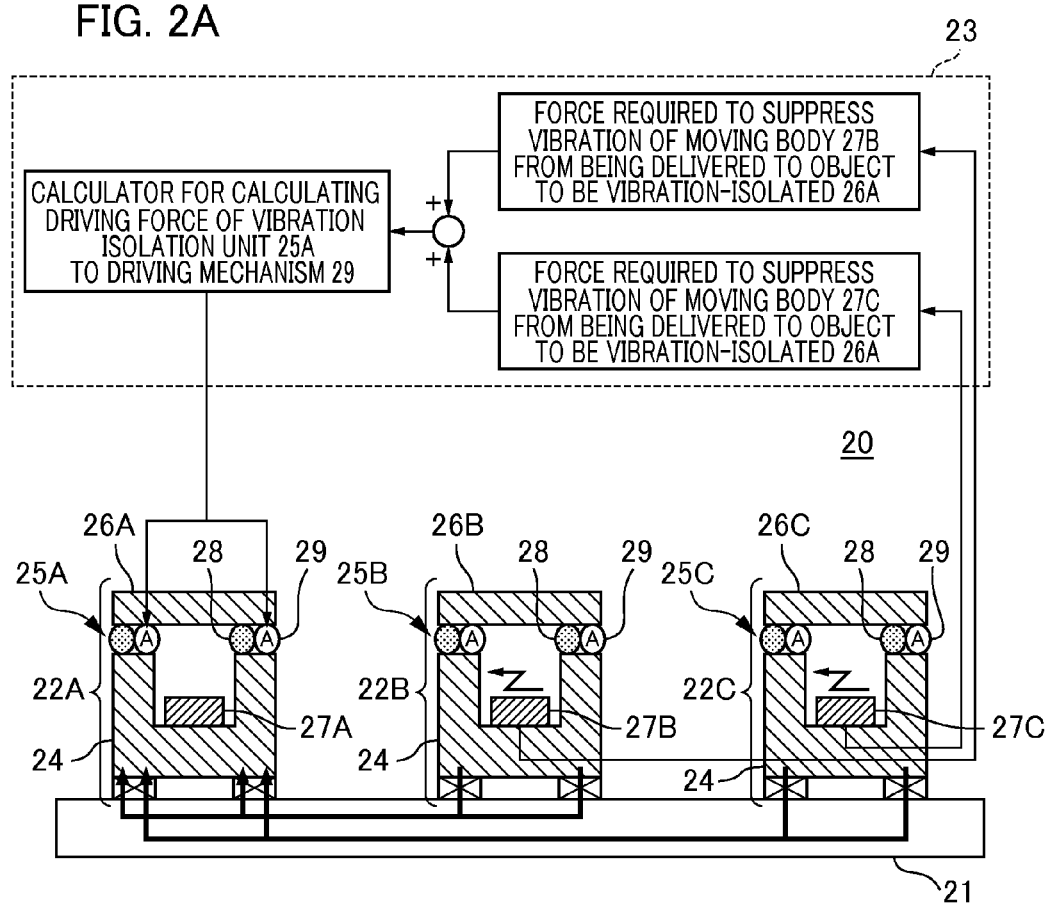
FIG. 2A is a schematic view illustrating the configuration of a lithography system according to a first embodiment of the present invention.
Figure 2B:
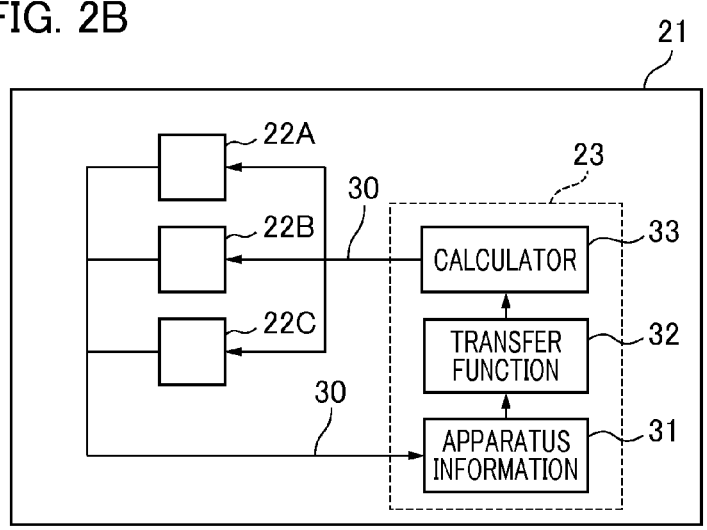
FIG. 2B is a schematic view illustrating the configuration of a control unit connected to the components of an imprint apparatus.

Next, a description will be given of a lithography system (lithography method) according to a first embodiment of the present invention having a cluster configuration in which a plurality of lithography apparatuses is arranged. The term "cluster configuration" in the present embodiment refers to a configuration in which a plurality of the same lithography apparatuses is assembled on the same fixed base (floor) so as to ensure a footprint and productivity by sharing an external device such as a conveying robot or the like. Hereinafter, the imprint apparatus described above is applied as lithography apparatuses that form a cluster of the lithography system. Each of FIG. 2A and FIG. 2B is a diagram illustrating the configuration of a lithography system 20 according to the present embodiment, and, in particular, FIG. 2A is a schematic diagram including the configuration of the imprint apparatuses 22. The lithography system 20 includes three imprint apparatuses 22 (22A to 22C) that are arranged on the same fixed base (floor) 21, and a control unit 23 that centrally manages the imprint apparatuses 22A to 22C. Note that the installation number of the imprint apparatuses 22 in the lithography system 20 is not particularly limited as long as the installation number thereof is at least two or greater.

As shown in FIG. 2A, each of the imprint apparatuses 22 (22A to 22C) includes a frame 24 placed on a fixed base 21, an object to be vibration-isolated 26 that is connected to the frame 24 via a vibration isolation unit 25, and a moving body 27. In this case, the frame 24, the vibration isolation unit 25, the object to be vibration-isolated 26, and the moving body 27 correspond to the frame 14, the vibration isolation unit 16, the base member 15, and the wafer stage 6 in the imprint apparatus 1, respectively. In particular, the vibration isolation unit 25 includes a support mechanism 28 having spring and damper characteristics (elasticity), and a drive mechanism 29 constituted by an actuator for generating a vibration suppression force.

The control unit (controller) 23 is a unit configured to centrally control the operation, the adjustment, and the like of the components of the imprint apparatuses 22A and 22B. FIG. 2B is a schematic view illustrating the configuration of the control unit 23 that is connected to the components of three imprint apparatuses 22A to 22C, which are located on the fixed base 21, via a line (information transmitting unit) 30. The control unit 23 is constituted by a computer, a sequencer, or the like having a storage unit such as a magnetic storage medium or the like, and executes control of the components by a program or a sequence. In particular, in the present embodiment, the control unit 23 includes a calculator 33 that acquires and manages various types of apparatus information 31 about the imprint apparatuses 22A to 22C and, as the same time, derives and manages a transfer function 32 to be described below, and further computes a driving force (vibration suppression force) to be applied to the drive mechanism 29 provided in the vibration isolation unit 25. Note that the control unit 23 may be integrated with the lithography system 20, or may be installed at a location separate from the location where the lithography system 20 is installed to thereby be controlled remotely. Furthermore, the control unit 23 may form a control system in one imprint apparatus 22, or may also be configured as a whole such that each of the control systems included in all of the imprint apparatuses 22 is connected to a line.

Next, a description will be given of the effect of the lithography system 20. In the lithography system 20, the fixed base 21 vibrates due to the moving operation of the moving bodies 27A to 27C provided in the imprint apparatuses 22A to 22C, respectively. Accordingly, the control unit 23 first predicts vibration, which is delivered to any of the objects to be vibration-isolated 26 provided in the imprint apparatuses 22A to 22C due to the vibration of the fixed base 21, using the transfer function 32 serving as a control indicator. Then, the control unit 23 adjusts the driving force of the drive mechanism 29 such that vibration, which is expected to be delivered to the object to be vibration-isolated 26, is suppressed in advance. At this time, as shown in FIG. 2A, when the vibration of the object to be vibration-isolated 26A included in the imprint apparatus 22A is suppressed, the control unit 23 refers to, for example, vibration caused by the moving bodies 27B and 27C included in other imprint apparatuses 22B and 22C, respectively.

Figure 3A:
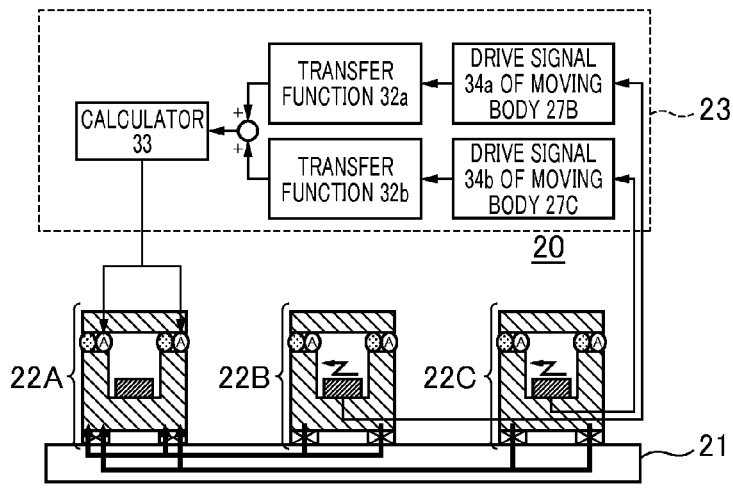
FIG. 3A is a block diagram illustrating the positioning of a transfer function with respect to an object to be vibration-isolated.
Figure 3B:
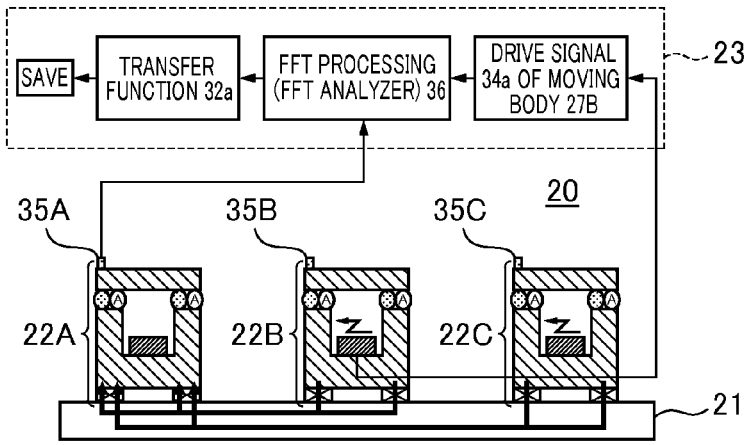
FIG. 3B is a block diagram illustrating the flow of deriving the transfer function of an object to be vibration-isolated with respect to a drive signal.
Figure 3C:
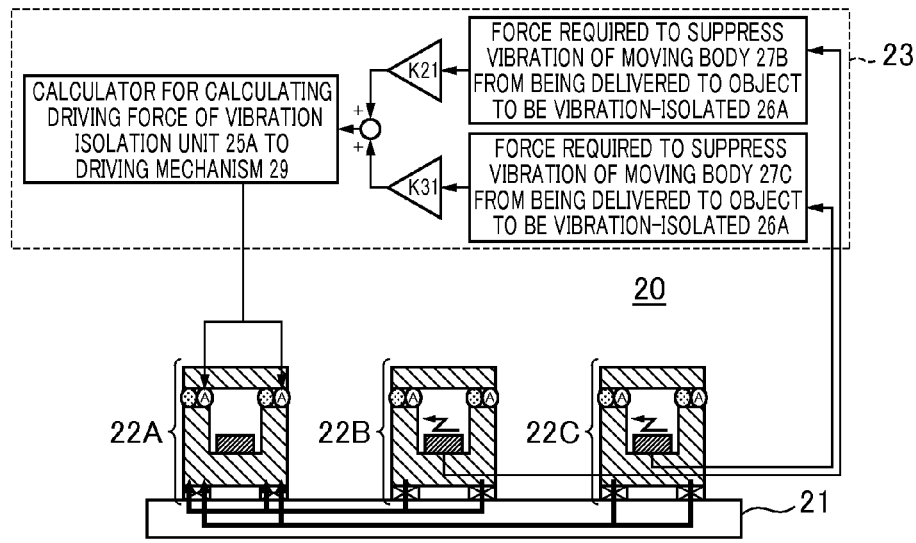
FIG. 3C is a block diagram illustrating another exemplary flow of deriving the transfer function of an object to be vibration-isolated with respect to a drive signal.

Here, consider the effect of vibration isolation for a first object to be vibration-isolated 26A provided in the imprint apparatus 22A serving as a first lithography apparatus. FIGS. 3A to 3C are block diagrams illustrating the transfer function 32 with respect to the object to be vibration-isolated 26A. In particular, FIG. 3A is a block diagram illustrating the positioning of the transfer function 32. In this case, the control unit 23 derives two transfer functions 32a and 32b from the input/output relationship between the drive signals (driving instruction information) 34a and 34b of second moving bodies 27B and 27C provided in other imprint apparatuses 22B and 22C serving as second lithography apparatuses and the object to be vibration-isolated 26A. At this time, the transfer functions 32a and 32b have a one-to-one relationship between input and output. In other words, while the transfer function 32a between the drive signal 34a of one moving body 27B and the object to be vibration-isolated 26A is measured, the other moving body 27C is kept stationary as shown in FIG. 3A to be described below. Then, the control unit 23 transmits the derived transfer functions 32a and 32b to the calculator 33, and transmits a value calculated by the calculator 33 to the drive mechanism 29A constituting the first vibration isolation unit (first vibration isolation unit) 25A to thereby adjust the driving force of the drive mechanism 29A. The control unit 23 executes the derivation of such a transfer function 32 between the imprint apparatuses 22A to 22C before moving to a manufacturing process.

FIG. 3B is a block diagram illustrating the flow of the derivation of the transfer function 32a of the object to be vibration-isolated 26A with respect to the drive signal 34a of the moving body 27B. In the present embodiment, in order to derive the transfer function 32a, the control unit 23 refers to measured data by a measuring instrument 35A (35B, 35C) installed as an output on the object to be vibration-isolated 26A (26B, 26C). The measuring instrument 35A is a measurement unit that is any one of an acceleration sensor, a velocity sensor, or a displacement sensor. In general, these measuring instruments include much noise in a signal in a low frequency range. However, in the present embodiment, the control unit 23 uses the measured data by the measuring instrument 35A only when deriving the transfer function 32a, but does not use the measured data after the lithography system 20 has transitioned to a manufacturing process. Note that measurement for deriving the transfer function 32a may be executed in plural times as long as time allows. By averaging these measured data, the influence of noise may further be reduced. Also, if the vibration of the object to be vibration-isolated 26A is intentionally increased by increasing the acceleration of the moving body 27B during measurement greater than that during a manufacturing process, the output of the measuring instrument 35A is prevented from being obscured in noise. This may also reduce the influence of noise.

On the other hand, as an input of the present embodiment, the control unit 23 employs the drive signal 34a to be transmitted to the moving body 27B as described above. Since the control unit 23 uses the input employed herein not only for the derivation of the transfer function 32a but also as a signal for feedforward control, the input accuracy is important. This is because a feedforward control is performed in advance and works to offset a disturbance based on a control signal before the disturbance is delivered to the object to be vibration-isolated 26A. Here, the vibration of the fixed base 21 is caused by the motion (movement) of the moving body 27B. In other words, if the control unit 23 can accurately grasp the motion of the moving body 27B, the control unit 23 can also accurately grasp the vibration generated in the fixed base 21. Accordingly, since the drive signal of the moving body 27B is a signal itself for directing the motion of the moving body 27B, the control unit 23 utilizes the drive signal as information for accurately grasping the motion of the moving body 27B.

In consideration of these, the control unit 23 processes the drive signal 34a of the moving body 27B and the measured data by the measuring instrument 35A using an FFT (Fast Fourier Transform) analyzer 36 provided therein to thereby derive the transfer function 32a. The derived transfer function 32a is stored in a storage device in the control unit 23. By the method described above, the control unit 23 also derives the transfer function 32b of the object to be vibration-isolated 26A with respect to the drive signal of the moving body 27C, and further derives the transfer function 32 related to all the combination of the imprint apparatuses 22B and 22C.

Here, all of the transfer functions 32 are known, the control unit 23 can predict the motion of the object to be vibration-isolated 26 with respect to each of the drive signals 34. Then, the control unit 23 applies a driving force for suppressing the motion of one object to be vibration-isolated 26 using the drive mechanism 29 provided in the vibration isolation unit 25 as appropriate, and thus, can suppress the vibration caused by the moving bodies 27 included in the surrounding imprint apparatuses 22. As shown in FIG. 3B, although the FFT analyzer 36 is embedded within the control unit 23, for example, the transfer function 32a may be determined through simulation in advance. Furthermore, as shown in FIG. 3C, the control unit 23 may have a configuration having gain adjustment units K21 and K31 configured to adjust a gain of a driving force applied to the drive mechanism 29. In accordance with this arrangement, the control unit 23 may adjust the driving force of the drive mechanism 29 while referring to the measured data on the object to be vibration-isolated 26 in advance, and thus, vibration isolation performance may further be increased.

As described above, the lithography system 20 of the present embodiment may be provided that is preferably capable of damping transmission of vibration from the surrounding imprint apparatuses 22 around one imprint apparatus 22 in the cluster configuration including a plurality of the imprint apparatuses 22.

Second Embodiment

Figure 4A:
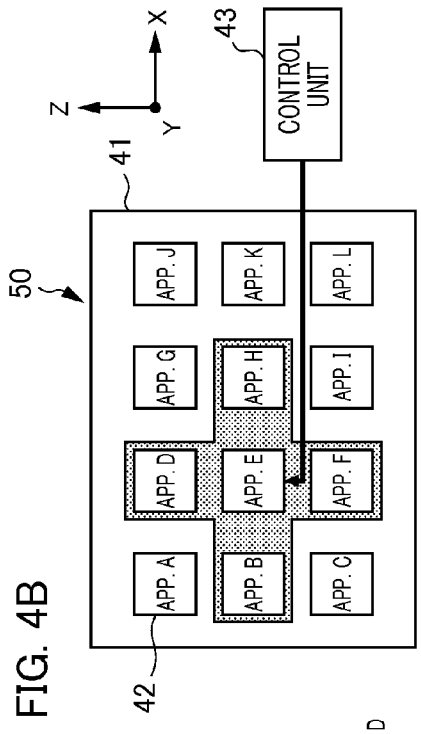
FIG. 4A is a diagram illustrating a lithography system for explaining a first method for selecting a transfer function according to a second embodiment of the present invention.
Figure 4B:
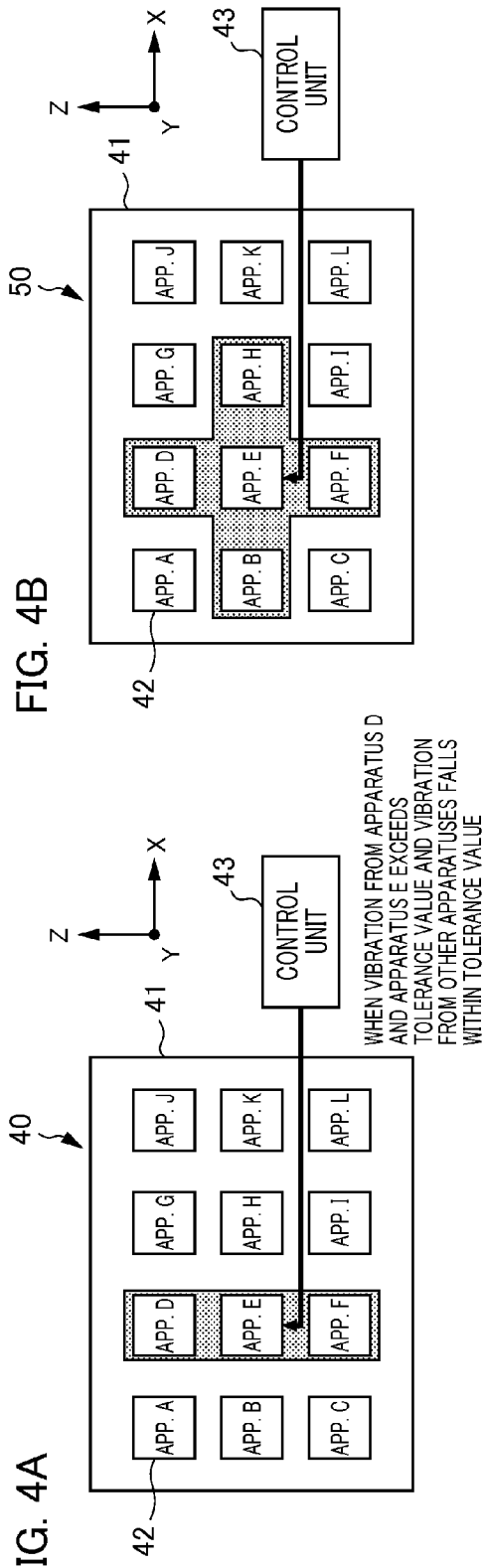
FIG. 4B is a diagram illustrating a lithography system for explaining a second method for selecting a transfer function according to a second embodiment of the present invention.
Figure 4C:
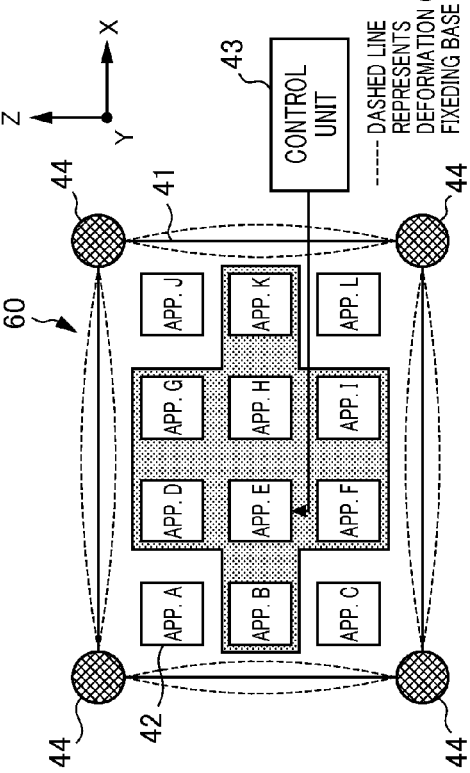
FIG. 4C is a diagram illustrating a lithography system for explaining a third method for selecting a transfer function according to a second embodiment of the present invention.

Next, a description will be given of a lithography system (lithography method) according to a second embodiment of the present invention. In the first embodiment, the control unit 23 derives a transfer function 32 related to each of all of the imprint apparatuses 22 having a cluster configuration, and calculates the driving force of the drive mechanism 29 using all of the transfer functions 32. In contrast, a feature of the lithography system of the present embodiment lies in the fact that a control unit appropriately selects and uses the transfer function 32 based on apparatus information about the arrangement of the imprint apparatuses upon calculation of the driving force of the drive mechanism 29. FIGS. 4A to 4C are schematic diagrams illustrating a lithography system of the present embodiment as viewed from the top (Z direction) of a fixed base. The same components of the imprint apparatuses as those in the imprint apparatus 22 according to the first embodiment as shown in FIG. 2A or the like are designated by the same reference numerals, and explanation thereof will be omitted. Each of lithography systems 40, 50, and 60 shown in FIG. 4A to FIG. 4C includes twelve imprint apparatuses 42 (apparatuses A to L) that are arranged on the same fixed base 41, and a control unit 43 that centrally manages the imprint apparatuses 42. Hereinafter, a description will be given of three methods for selecting a transfer function in this case.

Firstly, a first selection method for a transfer function will be described. In the lithography system 40 shown in FIG. 4A, the control unit 43 only uses the drive signal 34 of the moving body 27, for which the measured data by the measuring instrument 35 is equal to or greater than the tolerance value, through previous measurement or simulation. Here, the tolerance value is, for example, a value of a micro-meter order. Next, the control unit 43 determines whether or not the maximum value of the measured data of the surrounding imprint apparatuses 42 with respect to the object to be vibration-isolated 26 provided in one imprint apparatus 42 (e.g., an apparatus E in FIG. 4A) exceeds the tolerance value. Next, the control unit 43 extracts the referring moving bodies 27 (e.g., the moving bodies in apparatuses D and F in FIG. 4A) based on the determination result. Then, the control unit 43 only refers to the drive signal 34 of the extracted moving body 27 and derives a transfer function to thereby calculate the driving force of the drive mechanism 29.

Next, a second selection method for a transfer function will be described. In the lithography system 50 shown in FIG. 4B, the control unit 43 only extracts (sets) the moving bodies 27 adjacent to the object to be vibration-isolated 26 provided in one imprint apparatus 42 (e.g., an apparatus E in FIG. 4B) in advance. In this case, the moving bodies 27 to be extracted are, for example, the moving bodies 27 provided in apparatuses B, D, F, and H shown in FIG. 4B. Then, the control unit 43 only refers to the drive signals 34 of the extracted moving bodies 27 and derives a transfer function to thereby calculate the driving force of the drive mechanism 29. This method is effective when it is apparent that the influence of vibration caused by other imprint apparatus 42, which is relatively distant from the imprint apparatus 42 having the object to be vibration-isolated 26, is small, for example, when the fixed base 21 exhibits high rigidity.

Next, a third selection method for a transfer function will be described. In the lithography system 60 shown in FIG. 4C, the control unit 43 first predicts a deformation of the fixed base 41 itself in advance based on the installation position of a main strut 44 of the fixed base 41. Then, the control unit 43 only uses a transfer function relating to the moving body 27 included in the imprint apparatus 42 which is located over the belly to the deformation of the fixed base 41. Here, the term "main strut" refers to a main strut for supporting the fixed base 41. For example, the main strut refers to a strut that extends from the ground surface, on which a building such as a factory or the like is erected, to the ceiling so as to support the building in a stable manner. Since the main strut 44 is rigidly installed on the ground surface, the vicinity of the main strut 44 of the fixed base 41 exhibits high rigidity, and thus, deformation and vibration are small. In other words, the moving body 27 included in the imprint apparatus 42, which is installed far away from the main strut 44, may readily be the source of vibration of the fixed base 41. Accordingly, the control unit 23 extracts the moving bodies 27 of other imprint apparatuses 42 excluding the imprint apparatuses 42 (apparatuses A, C, J, and L), which is located near the main strut 44, with respect to the object to be vibration-isolated 26 provided in one imprint apparatus 42 (e.g., an apparatus E shown in FIG. 4C). Then, the control unit 43 only refers to the drive signals 34 of the extracted moving bodies 27 and derives a transfer function to thereby calculate the driving force of the drive mechanism 29A. As described above, each of the lithography systems 40, 50, and 60 of the present embodiment provides the same effect as that in the first embodiment. Additionally, in particular, when the installation number of the imprint apparatuses 42 having a cluster configuration is large, the control of the control unit 43 may be simplified.

Figure 4D:
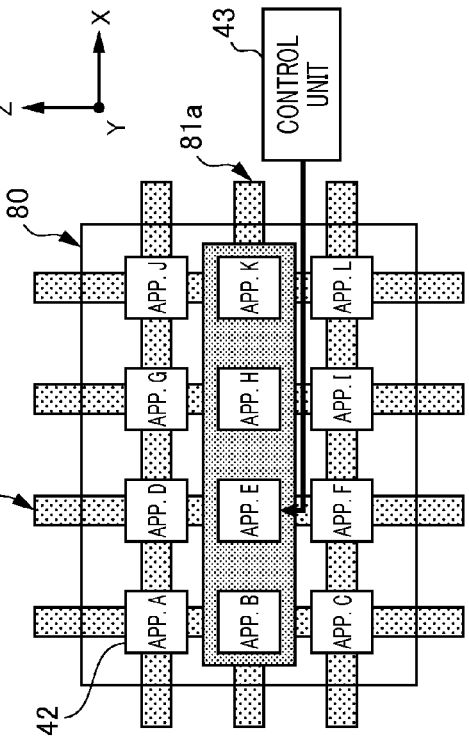
FIG. 4D is a diagram illustrating a lithography system for explaining a fourth method for selecting a transfer function according to a second embodiment of the present invention.

Furthermore, a fourth selection method for a transfer function will be described. In the lithography system 80 shown in FIG. 4D, the control unit 43 extracts (sets) an apparatus(es) which is greatly affected based on the relationship between the configuration of the beams of the fixed base 41 and the direction of the maximum oscillation force applied by the imprint apparatus 42. Hereinafter, a description will be given on the extraction method. In general, the beams of the fixed base 41 are configured in an orthogonal fashion as shown in FIG. 4D, and the imprint apparatus may be arranged in a grid thereon in many cases. As an example, consider the case where the imprint apparatuses 42 (apparatuses A to E shown in FIG. 4D) in the lithography system 80 generates the maximum oscillation force in the X direction in an article manufacturing step, and attention is given to the apparatus E. At this time, the apparatuses that are largely affected by the oscillation force of the apparatus E are the apparatuses B, H, and K that are arranged on the beam 81a in the same direction as the direction of the maximum oscillation force. The apparatuses D and F, which are arranged on the beam 81b in the direction perpendicular to the direction of the maximum oscillation force applied by the apparatus E, are insensitive to the oscillation force applied by the apparatus E. Also, the apparatuses A, C, G, I, J, and L, which are arranged on the beams other than the beams on which the apparatus E is arranged, that is, the beams other than the beams 81a and 81b, are insensitive to the maximum oscillation force applied by the apparatus E. The reason for this is because the bending rigidity of a beam in the longitudinal direction is typically lower as compared with that in the width direction and the height direction, and thus, vibration is readily transmitted in the longitudinal direction. In other words, also in the case of the fixed base 41 configured as shown in FIG. 4D, vibration is readily transmitted in the direction coincident with the longitudinal direction, and is hardly transmitted in the direction perpendicular to the longitudinal direction. From the above, when the apparatus E is controlled, the transfer functions of the apparatuses B, H, and K may be used. Of course, also in this case, the transfer functions of the apparatuses B and H adjacent to the apparatus E may be used. It is preferable that the arrangement of the beams of the fixed base 41 be grasped from the drawing of a building. However, the arrangement of the beams of the fixed base 41 may also be estimated from the oscillation test results by arranging measuring instrument on the fixed base 41 in advance. While, in the aforementioned example, the direction of the apparatus oscillation force perfectly matches the longitudinal direction of the beam, an apparatus in which the angle (acute angle) θ ($0°≤θ<90°$) formed by a straight line parallel to the direction of the apparatus oscillation force and a straight line parallel to the longitudinal direction of the beam is 60 degree or less is taken into account. This is because an apparatus in which 50% or greater of the apparatus oscillation force is transmitted in the longitudinal direction of the beam needs to be taken into account. The control unit 43 derives a transfer function by referring to only the drive signal 34 of the moving body 27 of the imprint apparatus 42 which falls under the aforementioned relationship to thereby calculate the driving force of the drive mechanism 29. As described above, each of the lithography systems 40, 50, 60, and 80 of the present embodiment provides the same effect as that in the first embodiment. Additionally, in particular, when the installation number of the imprint apparatuses 42 having a cluster configuration is large, the control of the control unit 43 may be simplified.

Third Embodiment

Figure 5A:
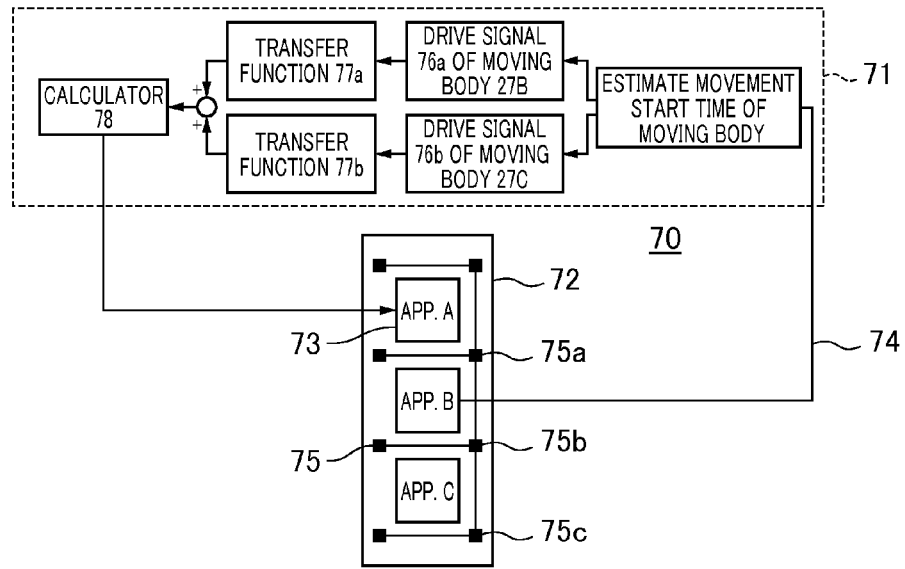
FIG. 5A is a block diagram illustrating the flow of control by a control unit including the configuration of a lithography system according to a third embodiment of the present invention.
Figure 5B:
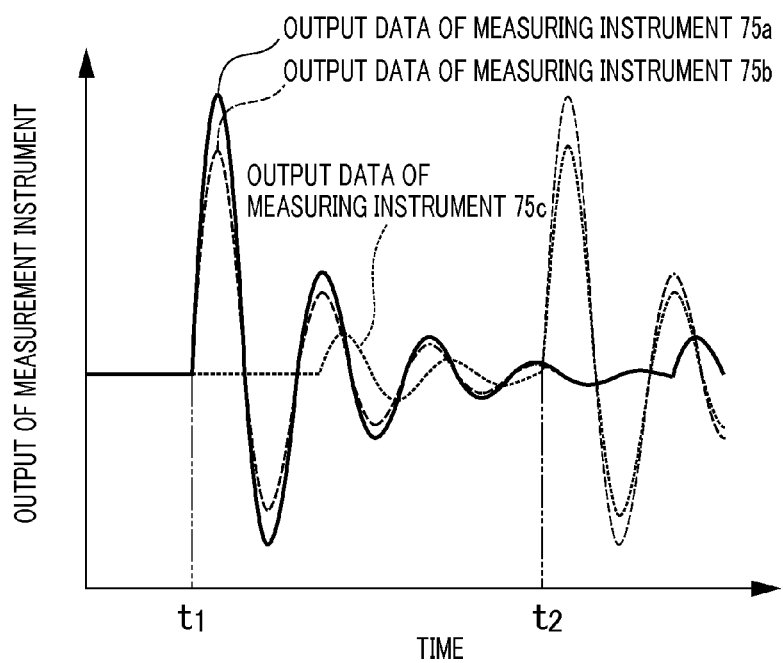
FIG. 5B is a graph illustrating hypothesized measured data by measuring instruments arranged at the positions shown in FIG. 5A.

Next, a description will be given of a lithography system (lithography method) according to a third embodiment of the present invention. In the first embodiment, the control unit 23 refers to the drive signals 34a and 34b of the moving bodies 27B and 27C, respectively, as appropriate, and reflects the drive signals 34a and 34b on the transfer functions 32a and 32b. In contrast, a feature of the lithography system of the present embodiment lies in the fact that a control unit stores the drive signals (drive information) of the moving bodies 27 in advance. Each of FIGS. 5A and 5B is a diagram regarding a lithography system 70 of the present embodiment. In particular, FIG. 5A is a block diagram illustrating the flow of the control of a control unit 71 including the configuration of the lithography system 70. The same components of the imprint apparatuses as those in the imprint apparatus 22 according to the first embodiment as shown in FIG. 2A or the like are designated by the same reference numerals, and explanation thereof will be omitted. The lithography system 70 includes three imprint apparatuses 73 (apparatuses A to C) that are installed on a fixed base 72, and the control unit 71 that is connected to each of the imprint apparatuses 73 via a line 74. Furthermore, the lithography system 70 includes at least one (in the present embodiment, eight) measuring instrument 75 that is installed on the fixed base 72. Here, let it be assumed that the vibration to be delivered to the object to be vibration-isolated 26a included in one imprint apparatus 73 (e.g., the apparatus A shown in FIG. 5A) is predicted. In this case, the control unit 71 employs the measured data by the measuring instruments 75 as a trigger for the movement start time of the moving bodies 27B and 27C included in other imprint apparatuses (the apparatuses B and C). In other words, the control unit 71 estimates the movement start time (driving instruction information) of the moving bodies 27B and 27C based on the measured data. Then, the control unit 71 derives transfer functions 77a and 77b by applying the estimated movement start time to the pre-stored drive signals 76a and 76b of the moving bodies 27, and then calculates the driving force of the drive mechanism 29A included in the imprint apparatus 73 (the apparatus A) using a calculator 78. More specifically, let it be assumed that the measured data (output data) of the measuring instruments 75a, 75b, and 75c, which are placed at the positions as shown in FIG. 5A, indicates the tendency of the graph as shown in FIG. 5B, which is represented by an output value with respect to the time. For example, when the outputs values of the measuring instruments 75a and 75b rapidly increase and the output value of the measuring instrument 75c exhibits no change at the time $t_1$, the control unit 71 predicts that the movement of the moving body 27B included in the apparatus B has been initiated. For the same reason described above, at the time $t_2$, the control unit 71 predicts that the movement of the moving body 27C included in the apparatus C has been initiated. As described above, the lithography system 70 of the present embodiment provides the same effect as that in the first embodiment. In particular, in the present embodiment, there is no need to establish a line connection between the control unit 71 and all of the moving bodies 27 included in the imprint apparatuses 73 having a cluster configuration, and thus, the configuration of the wiring of the lithography system 70 may be provided in a simple manner.

Figure 6:
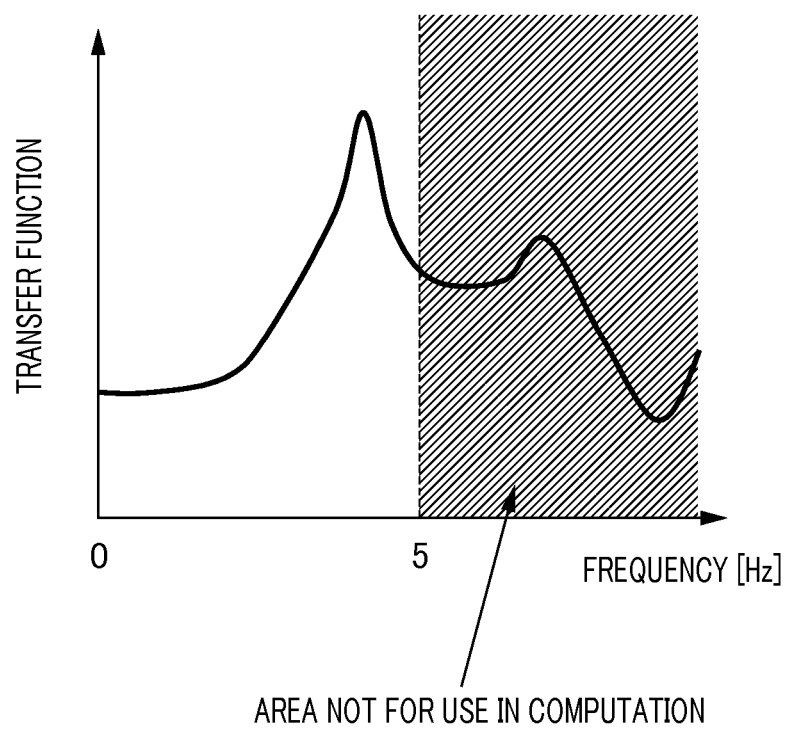
FIG. 6 is a graph illustrating an example when a computation is executed by limiting only to low frequency vibration.

For the computation of the driving force of the drive mechanism 29 according to the embodiments described above, a control unit may execute such computation by limiting low frequency vibration only. As described above, since noise is superimposed on a measuring instrument upon detecting low frequency vibration, the influence of noise may be reduced by such computation. For example, as shown in FIG. 6, when the measurement limitation of a measuring instrument is 5 Hz, the control unit executes the computation only for low frequency vibration having the frequency of 5 Hz or less. In contrast, for high frequency vibration having low noise, the control unit executes a conventional floor vibration feedforward control. In other words, in this case, the control unit may perform the control of the embodiment and the conventional control in combination.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using an imprint apparatus configuring the lithography system described above. Further, the manufacturing method may include a step of etching the substrate on which a pattern has been formed. When other article such as a patterned medium (storage medium), an optical element, or the like is manufactured, the manufacturing method may include other step of processing the substrate on which a pattern has been formed instead of the etching step. The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-281722 filed Dec. 17, 2010, and Japanese Patent Application No. 2011-124068 filed Jun. 2, 2011 which are hereby incorporated by reference herein their entirety.

What is claimed is:

1. A lithography system comprising:
   at least two lithography apparatuses that are disposed on the same fixed base, each of which comprises an object to be vibration-isolated, a moving body that moves based on driving instruction information, and a vibration isolation unit configured to generate a force for suppressing vibration imparted to the object to be vibration-isolated; and
   a control unit configured to control the lithography apparatuses,
   wherein the control unit is configured to control a vibration isolation unit included in a first lithography apparatus based on the driving instruction information to be given to a moving body included in a second lithography apparatus, and a control indicator expressing a relationship between the driving instruction information and the force for the vibration isolation unit.

2. The lithography system according to claim 1, further comprising:
   a measurement unit that is disposed on the object to be vibration-isolated and is configured to measure a value for vibration directed onto the object to be vibration-isolated.

3. The lithography system according to claim 2, wherein the measurement unit includes one of an acceleration sensor, a velocity sensor, and a displacement sensor.

4. The lithography system according to claim 2, comprising:
at least three lithography apparatuses,
wherein the control unit is configured to select the second lithography apparatus from the lithography apparatuses based on the output value produced by the measurement unit.

5. The lithography system according to claim 1, wherein the control unit is configured to further control the vibration isolation unit based on apparatus information about an arrangement of the lithography apparatuses.

6. The lithography system according to claim 5, wherein the second lithography apparatus is disposed adjacent to the first lithography apparatus.

7. The lithography system according to claim 5, wherein the fixed base comprises beams, and the control unit is configured to set the moving body included in the lithography apparatus that is arranged on the same beam as that of the fixed base on which the first lithography apparatus is arranged, and in which an acute angle formed by a straight line parallel to the longitudinal direction of the beam and a straight line parallel to the direction of the maximum oscillation of the moving body is 60 degree or less, to the moving body that refers to the driving instruction information to thereby control the vibration isolation unit included in the first lithography apparatus.

8. The lithography system according to claim 1, wherein each of the lithography apparatuses is an imprint apparatus that presses a mold against an uncured resin on a substrate to thereby form a resin pattern on the substrate.

9. The lithography system according to claim 8, wherein the object to be vibration-isolated is a base member holding a member holding device on which the mold is held.

10. The lithography system according to claim 1, further comprising:
at least one measurement unit configured to be arranged on the fixed base,
wherein the control unit is configured to calculate the driving instruction information by using the output value produced by the measurement unit arranged on the fixed base as a trigger for a movement start time of the moving body included in the second lithography apparatus, and to apply the driving instruction information to the pre-stored control indicator to thereby control the vibration isolation unit included in the first lithography apparatus.

11. The lithography system according to claim 1, wherein the vibration isolation unit generates the force having 5 Hz or less frequency.

12. The lithography system according to claim 1, wherein each of the lithography apparatuses is a charged particle beam exposure apparatus that exposes a pattern formed on an original to a substrate.

* * * * *